United States Patent [19]

Brunheim

[11] Patent Number: 5,298,898
[45] Date of Patent: Mar. 29, 1994

[54] DIGITAL TO ANALOG CONVERTER WITH DIGITAL CORRECTION CIRCUITRY

[75] Inventor: Rüdiger Brunheim, Villingen, Fed. Rep. of Germany

[73] Assignee: Deutsche Thomson-Brandt GmbH, Fed. Rep. of Germany

[21] Appl. No.: 925,696

[22] Filed: Aug. 7, 1992

Related U.S. Application Data

[63] Continuation of PCT/EP91/00101, Jan. 1, 1991.

[30] Foreign Application Priority Data

Jan. 29, 1990 [DE] Fed. Rep. of Germany ....... 4002501

[51] Int. Cl.[5] ............................................. H03M 1/06
[52] U.S. Cl. .................................... 341/118; 341/144
[58] Field of Search ............... 341/118, 119, 120, 121, 341/144, 145

[56] References Cited

U.S. PATENT DOCUMENTS 4,727,355 2/1988 Kohdaka et al. .................... 341/144

FOREIGN PATENT DOCUMENTS 0252321 1/1988 European Pat. Off. ....... H03M 1/06
0308194 3/1989 European Pat. Off. ....... H03M 1/08
0329148 8/1989 European Pat. Off. ....... H03M 1/74

OTHER PUBLICATIONS

Derwent Publications No. 88-055977/08 SU 1325-70-5-A (Jul. 1987).

*Primary Examiner*—Brian K. Young
*Attorney, Agent, or Firm*—Joseph S. Tripoli; Eric P. Herrmann; Lester L. Hallacher

[57] ABSTRACT

In a method of compensating for the tolerance errors in a digital-to-analog converter (D/A) the tolerance errors of the D/A are measured and individual correction factors are provided for each of the errors. The correction factors are stored and one of them is arithmetically combined with a portion of the digital number being converted to produce a combined signal. The combined signal is input into the digital-to-analog converter to produce an analog signal accurately representative of the digital signal.

3 Claims, 5 Drawing Sheets

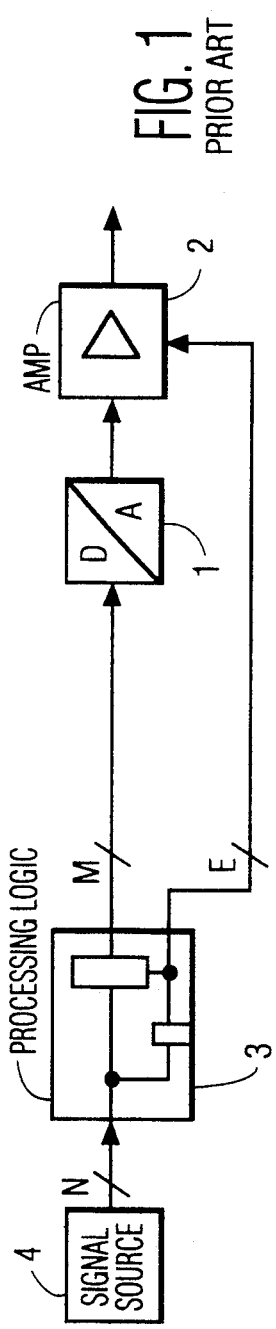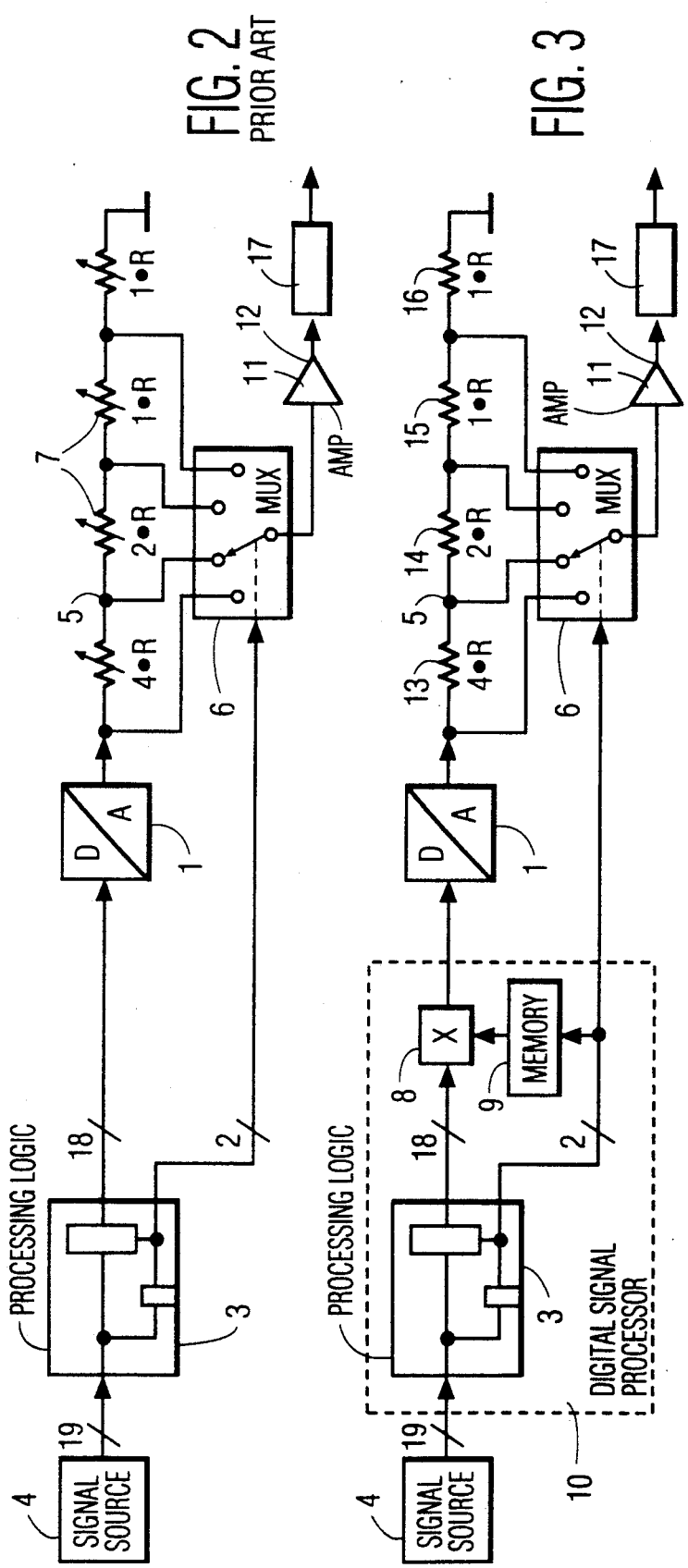

DIGITAL TO ANALOG CONVERTER WITH DIGITAL CORRECTION CIRCUITRY

This is a continuation of PCT application PCT/EP 91/00101 filed Jan. 19, 1991 by Rudiger Brunheim and entitled "Process and Device for Converting Digital Signals to Analog Signals".

The invention is directed to a process for converting a digital signal to an analog signal. Such a method is described in EP-A-0280321, in which a portion of a digitized signal, which can be a dual number is combined with at least one correction value. The correction value is selected by the portion of the digitized signal which is not combined with the correction value. Also, the digital-to-analog convert (D/A) described in EP-A-0280321 comprises two separate D/As connected to an adder. Moreover, it is only possible to perform a digital-to-analog conversion of fixed point dual numbers, digital-to-analog conversion of floating point dual numbers is not possible.

According to the present invention, the digital signal is generated as a dual number, preferably a floating point dual number. A floating point dual number consists of a mantissa with M bits and an exponent, E, on the base power of two. A D/A receives the mantissa of the floating point dual number and a switchable evaluator downstream of the D/A is controlled by the exponent of the floating point dual number. Correction signals representative of D/A tolerance errors are stored and used to alter the digital signal components and the digital signal is accurately converted to a corresponding analog signal.

A floating point dual number presentation as described above is used with computer systems also with PCs, all-digital amplifiers, digital pre-amplifiers and in signal processors, and is frequently supported by arithmetics processors.

In order for the floating point dual number presentation to be correct, the evaluator should be evenly divisible by the exponent base, (e.g. 1, ½, ¼, ⅛, 1/16), which is frequently ensured by using a very precisely balanced divider circuit in the evaluator. With the invention, the switchable evaluator, which also can be a switchable amplifier, is controlled by the exponent of the floating point dual number so that the converter values are correctly scaled and the correct switching stage is always selected.

A disadvantage of this type of digital-to-analog conversion is that the accuracy of the conversion is dependent upon the accuracy of the scaling of the evaluator switching stages. Tolerance errors in the switching stages can cause analog scaling errors and the analog signal will not accurately correspond to the digital signal being converted into a floating point dual number. In the prior art sufficiently high scaling accuracy and minimization errors in the switching stages are attained by using very precision components and on some occassions trimming potentiometers are used to precisely balance the divider circuit, which divides the amplification, (e.g. 1:1/1:¼:⅛:1/16:1). The solution using high-precision components is very cost-intensive because these components are very expensive and the solution using the potentiometers exhibits problems with the mechanical and thermal long-term stability of the components. It is the object of the invention to provide a method of accurately converting digital signals to analog signals.

With the invention, the dual number is arithmetically combined with at least one correction factor which balances the tolerance errors. The required correction factors are determined by measuring the voltage dividing elements in the evaluator and recording the inaccuracies as correction factors. The correction factors for the individual components are stored. Each time that a particular component produces a signal, the signal is altered (multiplied or added) by the correction factor for that component. When the dual number is a floating point dual number, the mantissa is arithmetically combined with the appropriate correction factors to balance tolerance errors. The invention eliminates the need for precise balancing of the scaling stages in the analog section of the D/A. Instead, the mantissa value, which is provided to the D/A, is changed by arithmetic combination with a correction factor. The exponent of the floating point dual number controls the selection of correction factor by use of a switching stage and an accurate analog output signal results because tolerance errors in the switching stage are offset. With the invention, digital offset of the switching stage tolerances is used instead of analog offset, which is common in the art.

The mantissa of the floating point dual number preferably is arithmetically combined with two correction factors. The first correction factor is selected through use of the exponent as described above. The second correction factor is determined by the mantissa of the floating point dual number. Addition is advisable for the arithmetic combination of the second correction factor with the mantissa. The second correction factor serves for the (pre-) rectification of a systematic conversion error in the D/A. When the dual number is a fixed point number, the correction factor preferably is selected through the fixed point dual number itself. The invention is not limited to dual numbers in floating point presentation, correction of systematic digital-to-analog converter errors can also be made to fixed point numbers using the invention.

Accordingly, it is another object of the invention to provide a D/A which reliably converts a digital signal to an analog signal. This is accomplished by connecting the input of the D/A to the output of an arithmetic computational unit which combines the number to be converted, or the mantissa of a floating point dual number, with at least one correction factor which compensates for tolerance errors in the switching stage. The correction factors for the individual switching stages are stored in a memory which is addressed by the exponent of a floating point dual number, or by the actual number for a fixed point number. The memory preferably is a programmable read only memory (PROM). Controllable memories, in particularly PROMs, can be affordably obtained as reliable standard components in many different types and dimensions. Programming of such memories is well known in the art.

In the drawings:

FIG. 1 is a circuit diagram of a prior art D/A with a switchable evaluator.

FIG. 2 is a wiring scheme of the converter arrangement of FIG. 1 including a switchable evaluator.

FIG. 3 is a preferred embodiment of a D/A.

Figure 5:
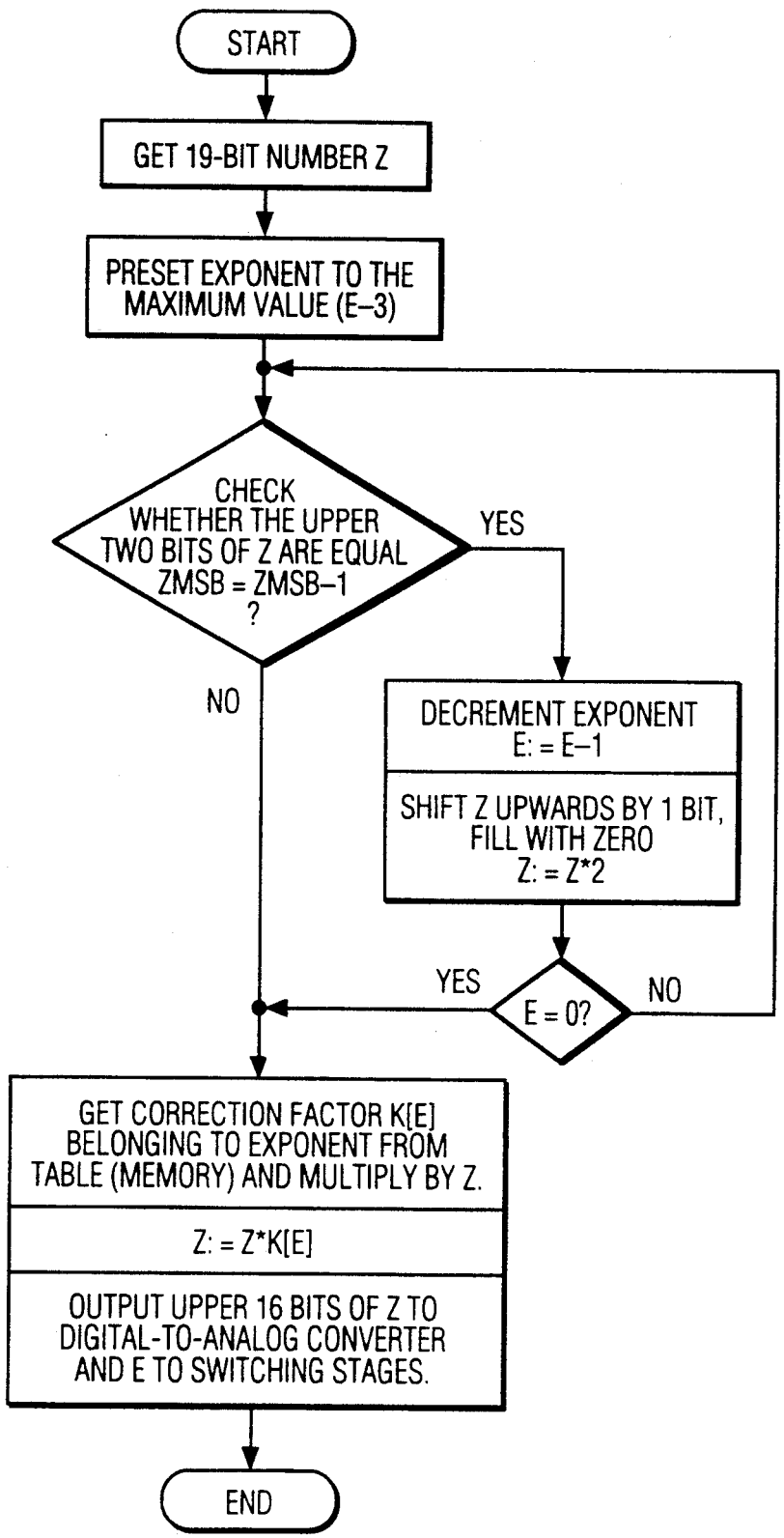
FIG. 5 is a flow chart for a digital signal processor for generating a floating point dual number from a fixed point dual number and the correction of the mantissa.

In FIG. 1, a conventional D/A 1 has a resolution of M bits and receives the mantissa of a floating point dual number having M bits as an input signal. A switchable evaluator or amplifier 2 receives the output of the D/A. The amplifier 2 is controlled by the exponent of the floating point dual number and can assume E switching conditions. The floating point dual number is generated from a digital signal 4 having N bits in a fixed point dual number representation by processing logic 3. The upper E bits of the signal 4 are checked. When, in two's complement presentation, the upper X bits of these E bits are equal, then the exponent takes the value $E-X$ and the two's complement number is shifted by $X-1$ bits to the left (FIG. 5). Then the upper M bits of the number shifted in this way form the mantissa. If the upper two bits of the number are not equal (no bits equal), then the exponent is zero and no shifting occurs because all bits are significant (FIG. 5).

In order to accommodate a floating point dual number presentation, the evaluator 2 must be capable of being switched in powers of the number two, as shown in FIG. 2 (1, ½¼). This arrangement then covers a range of values corresponding to a linear converter with a resolution of M+E-1 bits. For the D/A 1 in FIG. 2 the mantissa is 16 bits, the exponent is 2 bits and the digital signal 4 is 19 bits wide. Thus, the exponent can assume a maximum of four different states. The accuracy of the FIG. 2 system is dependent upon the tolerance errors of the evaluator components.

The switchable evaluator 2 shown in FIG. 2 includes a resistor network 5 which divides the output voltage of the D/A 1 in steps of powers of two and the individual taps are connected to a multiplexer 6 (CMOS switch). The multiplexer 6 is controlled by the exponent of the floating point dual number to insure that the scaling of the converter value is correct. The multiplexer 6 can be set to four different switching conditions. However, the resistors 7 within the divider network 5 must be very precise to assure that the analog scaling corresponds to the conversion in the digital range when forming the floating point dual number. In the prior art, the required accuracy was achieved through precise balancing of the resistors 7 during manufacture or through subsequent balancing using trimming potentiometers 7, as shown in FIG. 2. However, balancing by means of potentiometers is difficult because the balancing of one potentiometer alters the entire dividing ratio of the switching stage. The output terminal of the multiplexer 6 is connected to the input terminal of an impedance converter 11, the output terminal 12 of which is connected to the input terminal of a holding element 17.

In the digital-to-analog converter arrangement shown in FIG. 3, the need for precise balancing of the scaling stage resistors 13 through 16 is eliminated. Instead, the mantissa of each floating point number input to the D/A is multiplied by a correction factor in a multiplier 8. The correction factors are determined by the tolerance errors of the resistors 13, 14, 15 and 16. The switching stages are selected by the exponent of the number being processed and the proper correction factor is applied. The correction factors are stored in a memory 9, preferably a read only memory. Thus, instead of an analog scaling in the output section, digital scaling in the input section is used. The scaling process is not sensitive to terminal or mechanical influences and permits semi-automatic or fully automatic balancing.

Figure 4:
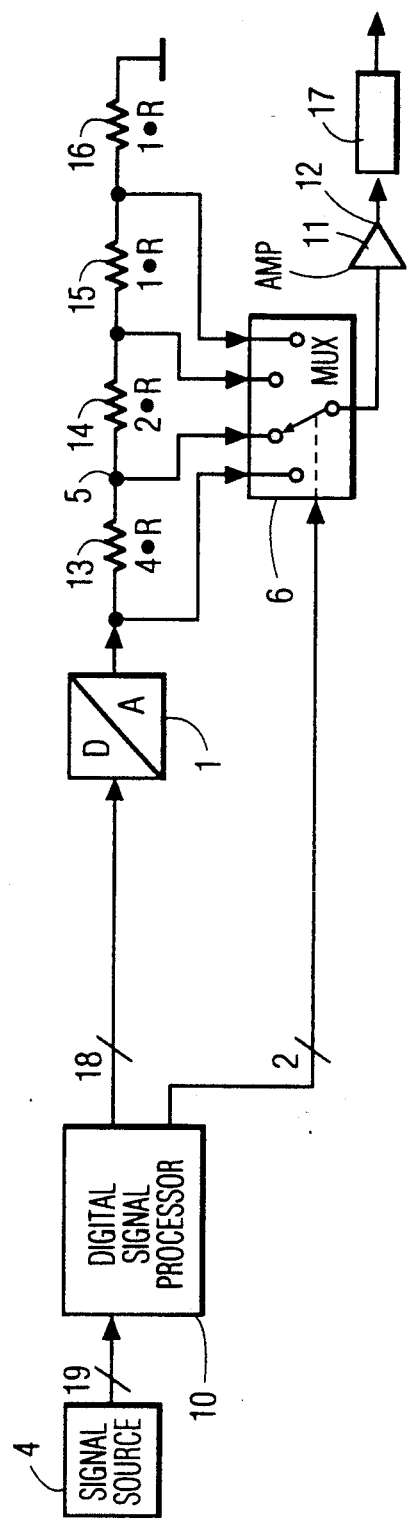
FIG. 4 is a D/A with a digital signal processor for automatically balancing the tolerance errors.

As shown in FIGS. 3 and 4, the processing logic 3, the memory 9, and the multiplier 8 can be replaced by a digital signal processor (DSP) 10 which stores the correction factors and modifies the mantissa in accordance with the exponent. FIG. 5 is a flow chart of a DSP for generating a floating point dual number from a fixed point dual number and the correction of the mantissa. The DSP 10 is able, through supplementary logic circuitry not shown, to perform a semi-automatic or fully automatic balancing of the scaling errors using a distortion factor analyzer or another appropriate device, provided by other circuitry. In such balancing, the correction factors are altered step by step until the error in the signal reaches a minimum. The final values are then permanently stored, using for example, an EEPROM, EPROM or SRAM with battery buffer.

The following is an example of a correction. The digital signal 4 has a width of 19 bits, the mantissa 16 bits and the exponent 2 bits (all two's complement). The D/A has a resolution of 16 bits. The multiplier multiplies a 16-bit mantissa data with a 15-bit wide correction factor to form a new 16-bit wide mantissa data. The output voltage of the converter is 1 V with full modulation (32768). Let it be assumed that the basic accuracy of the resistors in the divider is ±1%. The resistors 13, 14 and 15 deviate by 1% upwards (sum 7.07 R); the resistor 16 deviates by 1% downwards (0.99 R). The result is a divider ratio of Tv1=0.99/8.06 for the lowest stage with the exponent 0 (desired ratio=⅛). Therefore, this stage has a deviation of −1.74%. With fixed point multiplication, only correction factors with values <1 are possible. In order to correct both upwards and downwards deviations, the correction factor for the error-free direct stage 17 (exponent 3) is set to the value 32000. The remaining correction factors are calculated relative to this factor. Consequently, corrections by approx. 2% upwards are possible. A change in amplification of 32000/32768 results for all values. However, only the amplitude of the signal is slightly reduced; the quality of the signals is not impaired. The correction factor for the stage 0, therefore, computes to K0=K3*Tv0/Ti=32000*8.06/0.99/8=32566 (rounded to 15 bits). For the input data 32767 it follows: mantissa=32767; exponent=0. The mantissa must be multiplied by the factor K0=32566. With fixed point multiplication and subsequent reduction to 16 bits, the value 32565 results for the converter. The output voltage generated is 0.993804932 V. This voltage is now divided by the divider stage 0 to 0.122067851. The desired value for the output (taking into account the correction factor for stage 3 which manifests itself by way of a change in the amplification) is 32767/8 *1 V/32768 * 32000/32768=0.122066587 V. The error, with reference to the full modulation, is =0.0001265% (=19 bits).

If it is now assumed that the D/A also carries out a systematically faulty conversion of some or all of the digital signals, these faults are designated as systematic errors, then such a faulty conversion may be avoided, by using the invention. The type of digital signal is unimportant, the correction of the digital signals is not limited to a certain presentation of the dual numbers.

Figure 6:
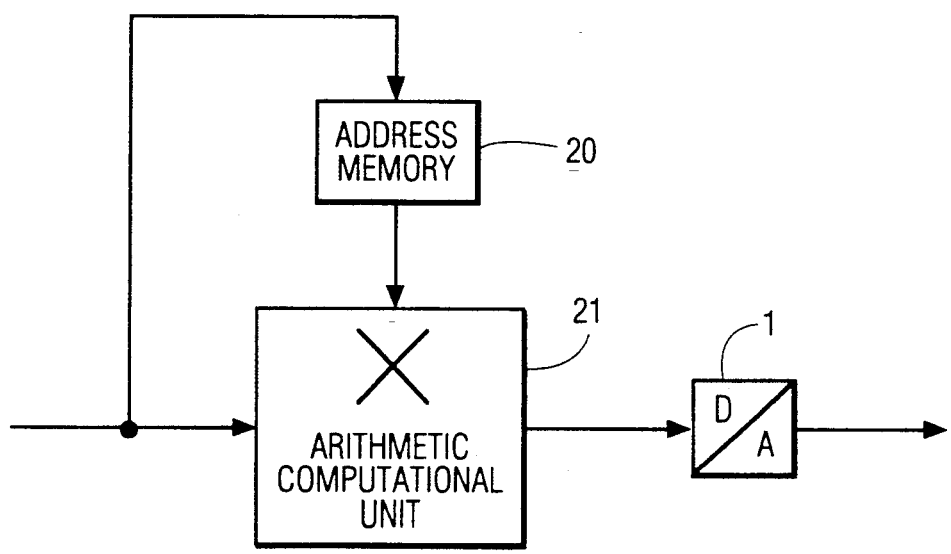
FIG. 6 is a wiring scheme of a D/A with precorrection of systematic D/A errors.

As shown in FIG. 6, the mantissa value of the fixed point number value is used for addressing a memory 20. The correction factors for all digital-to-analog conversion errors are stored in a memory 20 and, via appropriate addressing, the proper correction factors are selected by the incoming digital signal. The correction factors are combined with the mantissa value, or fixed point number value, in an arithmetic computational unit 21. It is advisable for this combination to be addition or subtraction. Therefore, the mantissa value, or fixed point number value, present to correspond to errors of the D/A is fed to the D/A and the analog value at the output of the D/A corresponds exactly with the digital value applied to the input terminal of the circuit.

Figure 7:
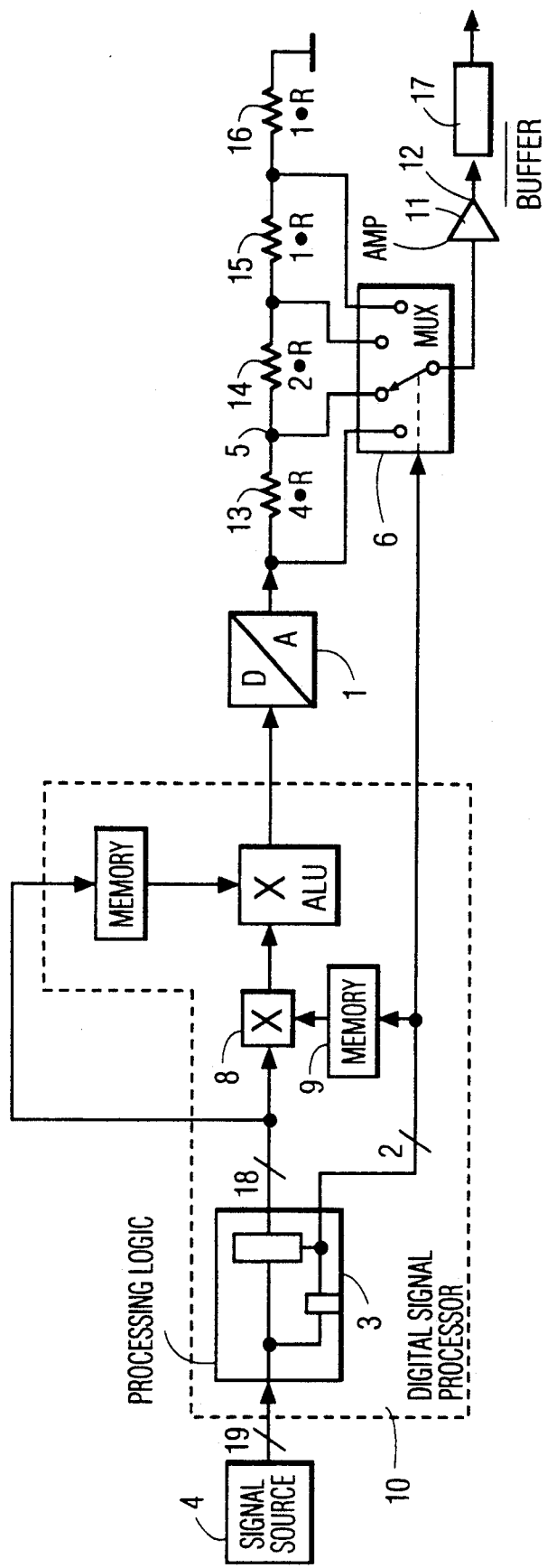
FIG. 7 shows the circuits of FIGS. 3 and 6 combined.

FIG. 7 shows a combination of the two correction forms described above. The computation unit 21 can be located in the signal path to the D/A before or after the computation unit 21. It is very useful if a common computation unit performs the task of the above-mentioned computation units and precompensates digital signals to be corrected for errors in the D/A using selected correction factors so that a highly accurate analog value is available at the output terminal of the circuit.

The errors identified above which can be corrected using the invention is not exhaustive. Other types of errors, not mentioned herein, can also be corrected. Also, the inventive device and method are not limited to the conversion of a single digital signal; they also can be used in the conversion of a multitude of digital data or a digital data stream.

I claim:

1. A digital to analog converter for converting floating point digital samples comprising a mantissa and an exponent to output analog values comprising:

a source of said floating point digital samples;

digital to analog conversion means for converting fixed point digital samples to analog values;

analog scaling means coupled to an output of said digital to analog conversion means and having an output terminal at which said output analog values are available, said analog scaling means having a control input terminal for providing variable scaling control signals to said scaling means, and said analog scaling means exhibiting processing inaccuracies corresponding to respective control signals;

memory means programmed with digital correction values corresponding to said processing inaccuracies;

means coupling the exponents of said floating point digital values to said control input terminal, and to said memory means for accessing respective correction values;

digital sample scaling means coupled between said source and said digital to analog conversion means for coupling scaled mantissa values of said floating point samples to said digital to analog conversion means, said digital scaling means having a control input terminal for providing variable scaling control signals thereto; and means for coupling respective correction values from said memory means to the control input terminal of said digital scaling means.

2. A digital to analog converter for converting floating point digital samples including a mantissa and an exponent to output analog values comprising:

digital to analog conversion means for converting fixed point digital samples to analog values;

analog scaling means coupled to an output of said digital to analog conversion means and having an output terminal at which said output analog values are available, said analog scaling means having a control input terminal coupled for receiving the exponent portions of said digital samples, and said analog scaling means exhibiting processing inaccuracies corresponding to respective exponent values;

means responsive to said exponents for correcting mantissa values for said processing inaccuracies exhibited by said analog scaling means and for coupling corrected mantissa values of said floating point samples to said digital to analog converting means.

3. The digital to analog converter set forth in claim 1 wherein said analog scaling means exhibits offset errors and said converter further includes means responsive to respective mantissa values for adding digital offset correction values to mantissa values coupled to said digital to analog converting means.

* * * * *